(12) United States Patent
Pileggi et al.

(10) Patent No.: US 6,385,760 B2
(45) Date of Patent: *May 7, 2002

(54) SYSTEM AND METHOD FOR CONCURRENT PLACEMENT OF GATES AND ASSOCIATED WIRING

(75) Inventors: Lawrence Pileggi, Pittsburgh, PA (US); Majid Sarrafzadeh, Wilmette, IL (US); Gary K. Yeap; Feroze Peshotan Taraporevala, both of San Jose, CA (US); Tong Gao, Fremont, CA (US); Douglas B. Boyle, Palo Alto, CA (US)

(73) Assignee: Monterey Design Systems, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/096,804

(22) Filed: Jun. 12, 1998

(51) Int. Cl.$^7$ .............................................. G06F 17/50
(52) U.S. Cl. .................................... 716/8; 716/2; 716/7
(58) Field of Search ............................... 716/1, 2, 7, 8, 716/9, 10, 11, 12, 14, 13

(56) References Cited

U.S. PATENT DOCUMENTS

| | | | |
|---|---|---|---|
| 4,495,559 A | * 1/1985 | Gelatt, Jr. et al. | 364/148 |
| 5,144,563 A | * 9/1992 | Date et al. | 716/9 |
| 5,218,551 A | * 6/1993 | Agrawal et al. | 364/491 |
| 5,237,514 A | * 8/1993 | Curtin | 364/490 |
| 5,251,147 A | * 10/1993 | Finnerty | 364/490 |
| 5,267,176 A | * 11/1993 | Antreich et al. | 716/10 |
| 5,636,125 A | * 6/1997 | Rostoker et al. | 364/468.28 |
| 5,742,510 A | * 4/1998 | Rostoker et al. | 364/468.03 |
| 5,745,363 A | * 4/1998 | Rostoker et al. | 364/468.28 |
| 5,784,289 A | * 7/1998 | Wang | 716/8 |
| 5,818,729 A | * 10/1998 | Wang et al. | 716/9 |
| 5,971,588 A | * 10/1999 | Scepanovic et al. | 364/468.28 |
| 6,070,108 A | * 3/2000 | Andreev et al. | 700/121 |

OTHER PUBLICATIONS

Civera et al., "Algorithms for operation scheduling in VLSI circuit design," IEE Proceeding–G, vol. 140, No. 5, pp. 339–346, Oct. 1993.*

Diaz–Alvarez et al., "Probabilistic Prediction of Wireability and Routing Requirements for High Density Interconnect Substrates", Electronic Components and Technology Conference, pp. 1265–1269, 1998.*

Scheible et al., "A High Density Placement Algorithm Based on Simulated Surface Tension", IEEE pp. 2048–2051, 1991.*

Kurdahi et al., "Techniques for Area Estimation of VLSI Layouts," IEEE Trans on CAD, vol. 8, No. 1, pp. 81–92, 1989.*

Lin et al., "An Efficient Relative Placement Algorithm for Custom Chip Design," IEEE Custom IC Conference, pp. 27.1.1–27.1.4, 1990.*

* cited by examiner

Primary Examiner—Matthew Smith
Assistant Examiner—Leigh Marie Garbowski
(74) Attorney, Agent, or Firm—Vierra Magen Marcus Harmon & DeNiro LLP

(57) ABSTRACT

A design tool for integrated circuits includes a placement tool which places logic gates and interconnect components concurrently. Probabilistic interconnect models are used to represent the collection of possible interconnect routings that provide acceptable circuit performance and routing area.

8 Claims, 3 Drawing Sheets

SYSTEM AND METHOD FOR CONCURRENT PLACEMENT OF GATES AND ASSOCIATED WIRING

BACKGROUND OF THE INVENTION

1. Field of the Invention

The present invention relates to integrated circuit design tools. In particular, the present invention relates to design tools that optimize area and performance for integrated circuits.

2. Discussion of the Related Art

The interconnection wiring ("interconnect") among circuit elements in an integrated circuit is expected to dominate signal delays and to limit achievable circuit density of an integrated circuit. Existing design methods, which treat interconnect as "parasitics" and focus on optimizing transistors and logic gates, are ill-equipped to provide a design which delivers the necessary performance. Typically, in a conventional design method, the circuit elements of an integrated circuit are first synthesized and placed. A global routing tool is then used to interconnect these circuit elements. Because placement and routing are performed relatively independently, even though some tools take into consideration the connectivity among circuit elements in providing the placement, the global routing tool's ability to address power, timing and congestion issues is severely limited.

Concurrent placement and wiring routing is disclosed in U.S. Pat. No. 4,593,363, entitled "Simultaneous Placement and Wiring for VLSI Chips" to Burstein et al. The '363 patent discloses an iterative method in which a global router is invoked to route networks redistributed under a hierarchical placement algorithm.

SUMMARY OF THE INVENTION

The present invention provides a method and a design tool for designing integrated circuits with emphasis on circuit performance. One method of the present invention pertains to a placement algorithm for placing circuit elements onto a target area of a semiconductor substrate according to the following steps: (a) providing an initial placement of the circuit elements onto a target area; (b) providing, for each of the nets interconnecting the circuit elements, a probabilistic model of interconnect wiring based on required performance for the net; (c) optimizing the cost function associated with the placement of the circuit elements and the corresponding wiring using an iterative placement algorithm; (d) updating the performance estimations during placement to facilitate continuous adjustments of the probabilistic wiring model. Thus, in a method of the present invention, the probabilistic model of interconnect wiring are provided according to performance requirements which are updated continuously.

The placement tool optimizes gate placement using timing estimates based on a probabilistic wiring model. The wiring model represents the local, probabilistic wiring density based on the continuously updated criticality of the net. The probabilistic wiring model represents nets based on where the wiring should be routed to attain the necessary performance. The placement optimization then modifies the placement to achieve aggregate wiring that is globally feasible. The present invention can be practiced in conjunction with any placement tool which is based on iterative improvement.

DETAILED DESCRIPTION OF THE PREFERRED EMBODIMENTS

The present invention provides a method that performs placement of circuit elements (e.g. gates) and interconnect wiring concurrently. To ensure that routing space is not unduly restricted before placement is finalized, the router of the present invention places interconnect wires ("interconnect") using a probabilistic representation ("smear"), rather than actual wiring, until predetermined points in the optimization process.

The present invention can be applied to an integrated circuit design system, such as any of those disclosed in copending patent applications ("Copending Applications"): (a) a patent application, entitled "Performance Driven Design Optimization Using Logical and Physical Information" by D. Boyle et al., Ser. No. 09/021,973, filed Feb. 11, 1998, and (b) a patent application, entitled "Method for Design Optimization Using Logical and Physical Information," by L. Pileggi et al., Ser. No. 09/097,299, filed on or about the same day as the present application. Both Copending Applications are assigned to Monterey Design Systems, Inc., which is also the Assignee of the present application. The disclosures of the Copending Applications are hereby incorporated by reference in their entireties.

Figure 1:
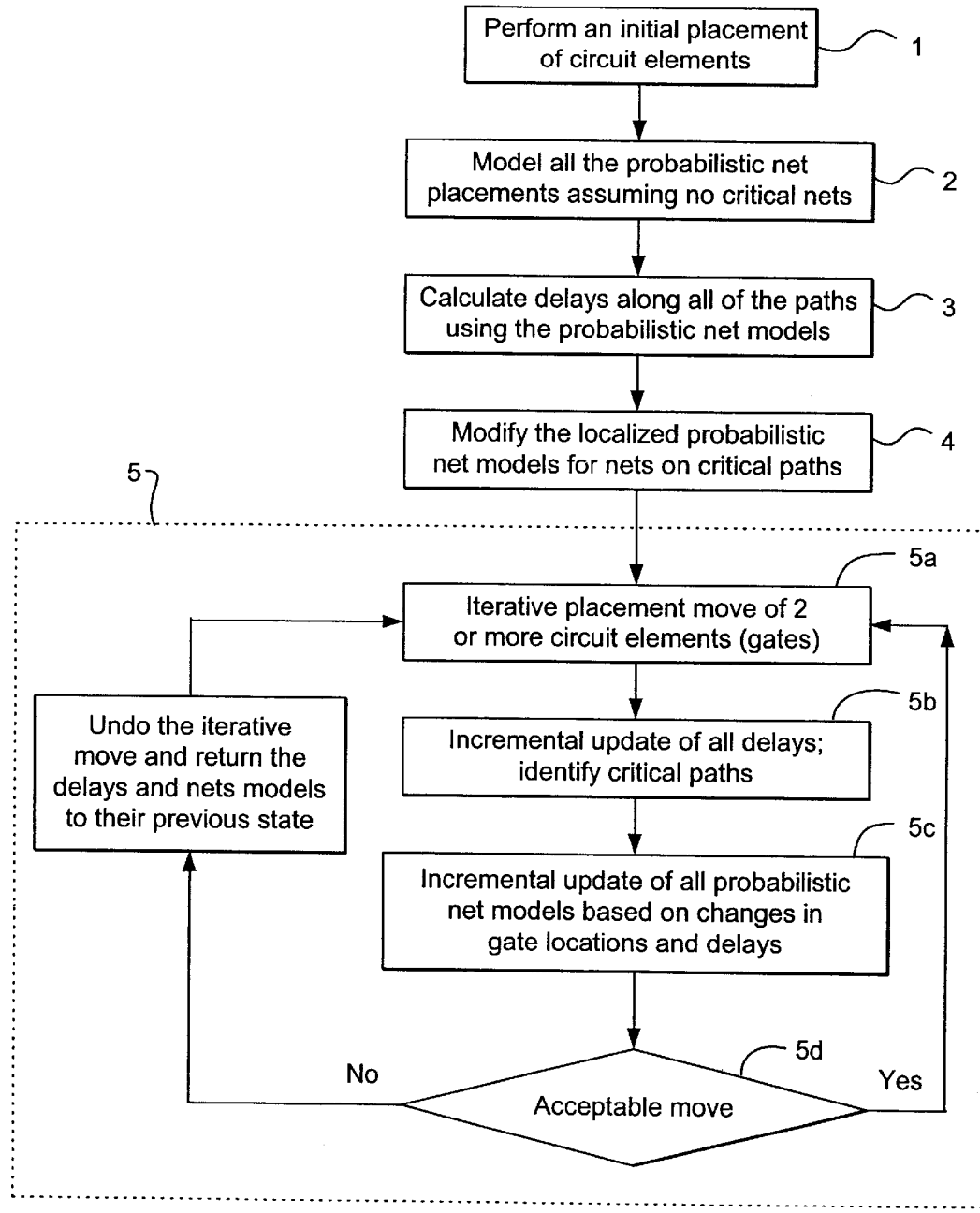
FIG. 1 is a flow diagram of a method of optimizing integrated circuit performance, in accordance with the present invention.

FIG. 1 is a flow diagram of a method for optimizing integrated circuit performance in accordance with the present invention. The method operates on an input net list (e.g., a logic gate-level net list synthesized from a behavioral description of an integrated circuit or a portion of an integrated circuit), from which circuit elements are clustered according to connectivity. At step 1 of FIG. 1, the clusters are mapped as an initial placement onto a 2-dimensional representation of the chip area. Any placement algorithm which is capable of placing non-uniform circuit elements can be used for the initial placement.

Figure 2A:
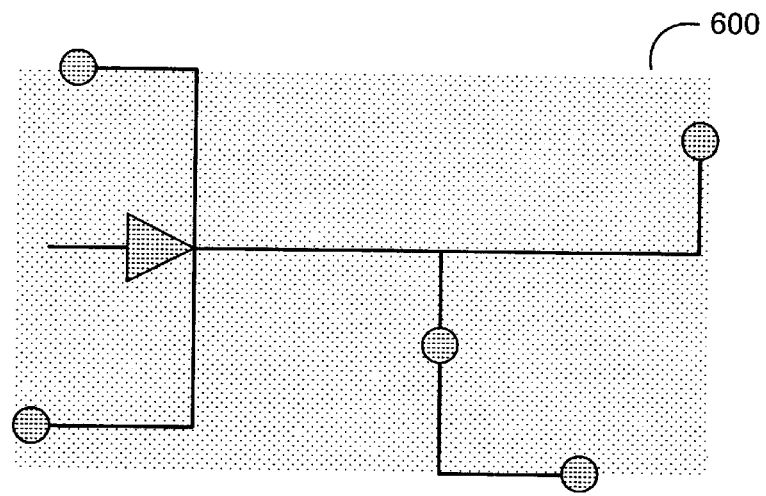
FIG. 2a provides an example of a smear over a bounding box 600 of a net.
Figure 2B:
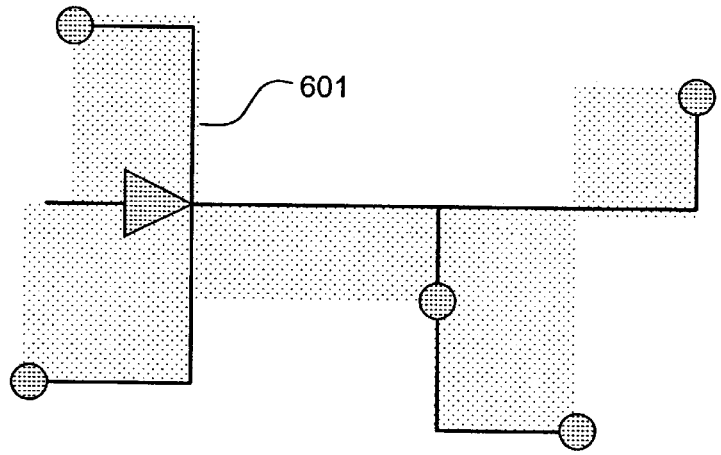
FIG. 2b provides a smear of the net of FIG. 2a, provided over localized bounding regions 601.
Figure 2C:
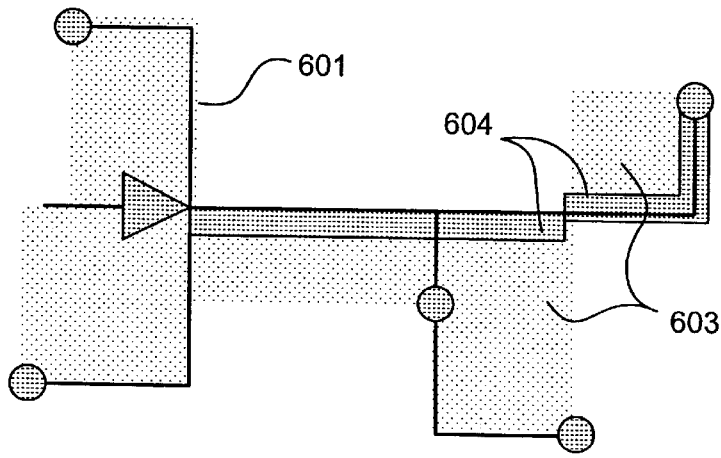
FIG. 2c provides a smear of the net of FIG. 2a, provided over localized bounding regions 601, but with multiple wire-smearing densities shown at areas 603 and 604.

At step 2, having mapped all circuit elements to individual 2-dimensional locations of the chip, each net wire placement is modeled in a probabilistic manner. At this step, all nets are considered equally critical. Each probabilistic wire placement ("smear") represents a set of best routes of minimum or close to minimum cost (e.g., interconnect delay). The smear can be represented, as shown in FIG. 2a, by the average routing length for a predetermined number of best routes over a bounding box (i.e., bounding box 600) covering the net. Alternately, and more accurately, a smear for a net can be represented (as shown in FIG. 2b) by the average interconnect length of the best routes averaged over relevant localized bounding regions indicated by shaded regions 601. The representation for the smear can be further refined, if necessary, to allow regions where more favorable routes are achievable to be identified. For example, FIG. 2c shows a smear representing the net of FIG. 2a, including areas 603 and 604 of different wiring densities. The darker shadings (i.e., areas 604) indicate regions where more favorable routes can be achieved.

At step 3, using the initial placement of the circuit elements and the smears, the delays for the nets and associated circuit elements are calculated. Since the smears are probabilistic, the delays calculated from the smears are necessarily probabilistic. In one embodiment, both the best case delay and the worst case delay are approximated over each smear.

Depending on the placement algorithm and the circuit element clusters, a statistical estimate of delay is provided for each net within a cluster. Such a statistical estimate of delay can be provided, for example, based on the fan-out at a driver of the net. A delay based on estimates of the resistance and the capacitance in a net ("RC calculations") can be provided for a net between circuit elements of different clusters. Where a net has a non-negligible portion of delay within a cluster and a non-negligible portion of delay between clusters, an estimate based on both the statistical estimate of delay and the RC calculations can be provided.

In this embodiment, the expected performance at each net is represented by a "slack graph". A slack graph includes, for each net, a "slack" value which is represented by the time difference between the arrival time and the required time of a signal on the net. The propagation delay of any logic gate can be estimated by conventional techniques, such as using Thevenin equivalent or effective load ($C_{eff}$) models.

At step 4, each net which lies along a critical path and which has either a negative slack or a small positive slack is identified. Since it is advantageous to minimize the delays in these nets, the smears of these nets are restricted to encompass only those routes producing the minimum delay, or close to minimum delay.

Figure 3A:
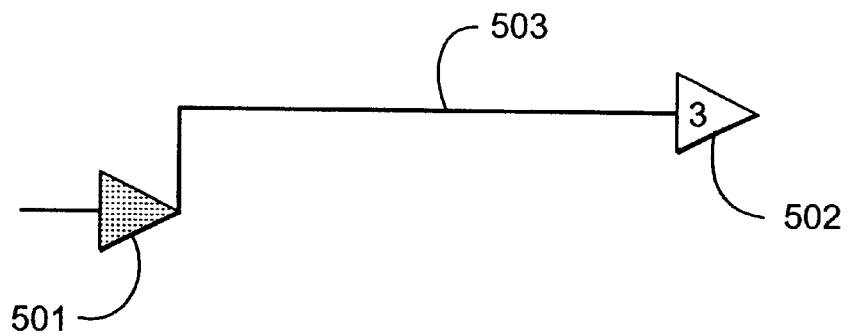
FIGS. 3a and 3b show equally acceptable (from a performance point of view) wiring configurations 503 and 504 for interconnecting gates 501 and 502.
Figure 3B:
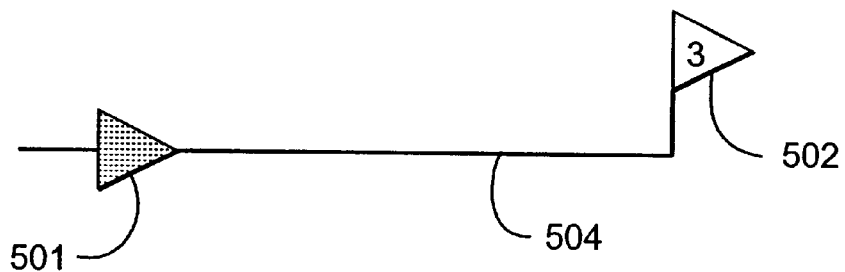
Figure 3C:
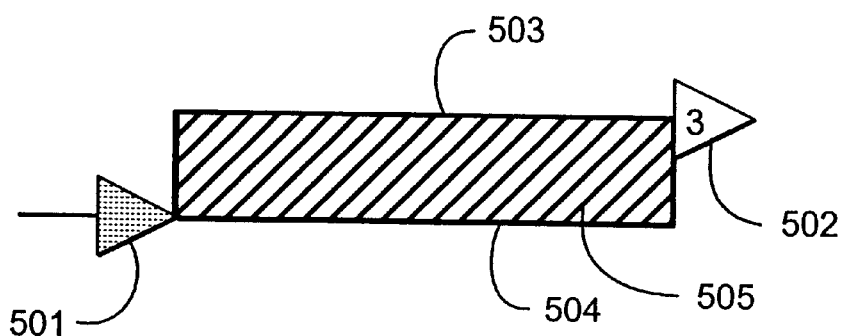
FIG. 3c shows a probabilistic smear 505 representing equally acceptable wiring configurations between and including wiring configurations 503 and 504.

Even though the nets along a critical path are most constrained in wiring placement, a smear of one of these nets still represents a set of routes of best performance. FIGS. 3a, 3b and 3c show equally acceptable (from a performance point of view) wiring routes 503 and 504 for interconnecting gates 501 and 502. Routes between routes 503 and 504 are also acceptable. (As shown, routes 503 and 504 are preferred routes, since any route between routes 503 and 504 incurs at least one additional via). Hence, a smear indicated by bounding box 505 represents the collection of best acceptable routes between and including routes 503 and 504, assuming via costs are negligible.

At step 5, an iterative placement algorithm based on minimizing a cost function is invoked. In this embodiment, the cost function has congestion, gate area, total wiring, power and delay components. One example of a suitable placement algorithm is the Fidduccia-Matheyses (FM) algorithm known in the art. Another example is any placement algorithm based on simulated annealing.

According to the present invention, smears associated with a circuit element are concurrently placed when the circuit element is placed. With each iterative placement move (step 5a), smears are derived based on existing slack information and the location change of the each circuit element involved in the iterative move. The delays and smears of each net are further refined in steps 5b and 5c. Specifically, at step 5b, the delays and slacks are incrementally updated. Then, at step 5c, the smears are updated based on the changes in slacks and circuit element placements.

In step 5d, a decision is made as to whether or not to keep the iterative placement move, according to the cost function and the acceptance criteria for the move. Typically, not only moves which improve the cost are accepted. For example, in simulated annealing-based algorithms, some uphill cost moves are accepted to avoid local minima, so as to achieve better global solutions.

As mentioned above, a "smear" represents a collection of best possible routes of less than a predetermined cost. One representation of a smear, referred to as a "bounding box smear" or a "localized bounding box smear", provides a wiring density calculated from a set of best routes over the associated area. The wiring density can be used to provide the congestion component of an overall cost function. The bounding box also provides a measure of the total interconnect wiring lengths, which can be used to estimate the total load capacitance driven by a driving circuit element, and hence the power dissipation of the driving circuit element. With wiring density and total interconnect wiring lengths, the bounding box smear thus estimates the integrated circuit area necessary for implementing the interconnect represented by the smear that achieves the required timing performance.

Since the wiring density is determined without regard to the smears associated with other circuit elements, the present invention provides a congestion measure that is based on the preferable position of the wire, rather than the constrained maximized route attached to a particular placement of the circuit elements to which the wire is associated. For a given location, the local wiring density, and hence congestion, is the sum of all smears at the location. During an iterative placement move, a gate and nets associated with the gate can be moved to reduce the local wiring density. A new smear is then calculated for each net at the new gate location. If the net has a large positive slack (i.e., the arrival time is much earlier than the required time), higher delay routes can be included in the smear. Conversely, where the placement of additional smears increase the congestion at a particular location, the cost estimate (e.g., the slack) on each net related to the smears at the location should be updated. In the present embodiment, an update to a slack is provided only after the cost difference exceeds a predetermined threshold.

The placement cost function considers a combination of the costs associated with area, power dissipation, delay, total wirelength, and wiring congestion. Placement moves are accepted or rejected based on changes in these costs. If a placement move is accepted (5d), the placement algorithm returns to step 5a. If the placement move is not accepted, the algorithm undoes the changes and executes step 5a to obtain a new placement move.

The above detailed description is provided to illustrate the specific embodiments above and is not intended to be limiting of the present invention. Numerous variations and modifications within the scope of the present invention are possible. For example, the present invention is applicable to not only to design of logic circuits with conventional signaling on conventional interconnects, but to design of other circuit technologies also, such as high speed mixed mode signals on RF transmission lines, or circuits using copper interconnect. The present invention can also provide a system useful not only in the design of electronic integrated circuits, but also to micromachine with a significant electronic circuit portions. The present invention is set forth in the following claims.

We claim:

1. A method for placing circuit elements onto a target area of a semiconductor substrate, comprising:

providing an initial placement of said circuit elements onto said target area, wherein during said initial placement, circuit elements are placed within bins;

providing, for each of a plurality of selected nets interconnecting said circuit elements, a probabilistic model of interconnect wiring, said probabilistic model incorporating a metric relating a routing length and a routing area, wherein said probabilistic models are provided for interconnect wiring between circuit elements of different bins;

providing a second placement of said circuit elements by reassigning selected ones of said circuit elements;

updating said probabilistic model of interconnect wiring for each of said selected ones of said circuit elements, according to said second placement;

subdividing the bins into successively smaller bins, wherein said steps of providing a second placement and adjusting the probabilistic models are repeated for said successively smaller bins; and when said smaller bins reach a predetermined size, transforming each of said probabilistic model into an actual interconnect wiring.

2. A system for placing circuit elements onto a target area of a semiconductor substrate, comprising:

a placement tool for placing an initial placement of said circuit elements onto said target area, the placement tool being configured to place said circuit elements within bins, the bins being subdivided into successively smaller bins;

means for providing, for each of a plurality of selected nets interconnecting said circuit elements, a probabilistic model of interconnect wiring, said probabilistic model incorporating a metric relating a routing length and a routing area, wherein the probabilistic models are provided for interconnect wiring between circuit elements of different bins, and wherein said placement tool, upon completion by said means for providing of said probabilistic model, provides a second placement of said circuit elements by reassigning selected ones of said circuit elements; and thereupon, said means for providing a probabilistic model updates said probabilistic model of interconnect wiring for each of said selected ones of said circuit elements according to said second placement, said steps of providing a second placement and adjusting the probabilistic models being repeated for said successively smaller bins until, when said smaller bins reach a predetermined size, transforming each of said probabilistic model into an actual interconnect wiring.

3. A method for placing circuit elements onto a target area of a semiconductor substrate, comprising:

providing an initial placement of said circuit elements onto said target area;

providing, for each of a plurality of selected nets interconnecting said circuit elements, a probabilistic model of interconnect wiring, said probabilistic model incorporating a metric relating a routing length and a routing area, wherein said metric relates an average routing length over a predetermined number of routes having a substantially minimal interconnect delay over a routing area represented by a bounding box;

providing a second placement of said circuit elements by reassigning selected ones of said circuit elements; and updating said probabilistic model of interconnect wiring for each of said selected ones of said circuit elements, according to said second placement.

4. A method for placing circuit elements onto a target area of a semiconductor substrate, comprising:

providing an initial placement of said circuit elements onto said target area;

providing, for each of a plurality of selected nets interconnecting said circuit elements, a probabilistic model for interconnect wiring, said probabilistic model incorporating a metric relating a routing length and a routing area, wherein said metric relates an average interconnect length over a predetermined number of routes having a substantially minimal interconnect delay over two or more bounding regions;

providing a second placement of said circuit elements by reassigning selected ones of said circuit elements; and updating said probabilistic model of interconnect wiring for each of said selected ones of said circuit elements, according to said second placement.

5. A method as in claim 4, wherein said two or more bounding regions have different wiring densities.

6. A system for placing circuit elements onto a target area of a semiconductor substrate, comprising:

a placement tool for placing an initial placement of said circuit elements onto said target area; and means for providing, for each of a plurality of selected nets interconnecting said circuit elements, a probabilistic model of interconnect wiring, said probabilistic model incorporating a metric relating a routing length and a routing area, wherein said metric relates an average routing length over a predetermined number of routes having a substantially minimal interconnect delay over a routing area represented by a bounding box, and wherein said placement tool, upon completion by said means for providing of said probabilistic model, provides a second placement of said circuit elements by reassigning selected ones of said circuit elements; and thereupon, said means for providing a probabilistic model updates said probabilistic model of interconnect wiring for each of said selected ones of said circuit elements, according to said second placement.

7. A system for placing circuit elements onto a target area of a semiconductor substrate, comprising:

a placement tool for placing an initial placement of said circuit elements onto said target area; and means for providing, for each of a plurality of selected nets interconnecting said circuit elements, a probabilistic model of interconnect wiring, said probabilistic model incorporating a metric relating a routing length and a routing area, wherein said metric relates an average interconnect length over a predetermined number of routes having a substantially minimal interconnect delay over two or more bounding regions, and wherein said placement tool, upon completion by said means for providing of said probabilistic model, provides a second placement of said circuit elements by reassigning selected ones of said circuit elements; and thereupon, said means for providing a probabilistic model updates said probabilistic model of interconnect wiring for each of said selected ones of said circuit elements, according to said second placement.

8. A system as in claim 7, wherein said two or more bounding regions have different wiring densities.

* * * * *